US012566664B2

(12) United States Patent
Yang

(10) Patent No.: US 12,566,664 B2
(45) Date of Patent: Mar. 3, 2026

(54) METHOD FOR CONTROLLING FLASH MEMORY MODULE AND ASSOCIATED FLASH MEMORY CONTROLLER AND MEMORY DEVICE

(71) Applicant: Silicon Motion, Inc., Hsinchu County (TW)

(72) Inventor: Tzu-Yi Yang, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 2 days.

(21) Appl. No.: 18/731,341

(22) Filed: Jun. 2, 2024

(65) Prior Publication Data

US 2025/0077343 A1      Mar. 6, 2025

(30) Foreign Application Priority Data

Aug. 30, 2023      (TW) .................................. 112132768

(51) Int. Cl.
  G06F 11/00          (2006.01)
  G06F 1/30           (2006.01)
        (Continued)
(52) U.S. Cl.
  CPC ............ G06F 11/1004 (2013.01); G06F 1/30 (2013.01); G06F 11/0793 (2013.01); G06F 11/1666 (2013.01); G11C 29/70 (2013.01)
(58) Field of Classification Search
  None
  See application file for complete search history.

(56) References Cited

U.S. PATENT DOCUMENTS 6,785,751 B1    8/2004  Connor
9,478,271 B2   10/2016  Chen
                (Continued)

FOREIGN PATENT DOCUMENTS

TW          I596480 B      8/2017
TW          I606388 B     11/2017
                (Continued)

OTHER PUBLICATIONS

"Understanding Flash: Blocks, Pages and Program / Erases" (Year: 2014).*

*Primary Examiner* — Bryce P Bonzo
*Assistant Examiner* — Gabriella Kanani Shelton
(74) *Attorney, Agent, or Firm* — Winston Hsu

(57)              ABSTRACT

The present invention provides a method for controlling a flash memory module. The method includes the steps of: after the flash memory module is powered on, determining whether the flash memory module encountered an abnormal power failure before the flash memory module is powered on; if the flash memory module encounters the abnormal power failure before the flash memory module is powered on, determining a last super block written by the flash memory module before powering on, where the super block includes multiple first blocks; determining a last rewritten page of the super block; determining a check range of the super block according to the last written page of the super block; determining a data weak region of the super block by reading the pages of the check range; and moving data in the weak data region to other regions of the super block or to another super block.

12 Claims, 13 Drawing Sheets

(51) Int. Cl.
G06F 11/07 (2006.01)
G06F 11/10 (2006.01)
G06F 11/16 (2006.01)
G11C 29/00 (2006.01)

(56) References Cited

U.S. PATENT DOCUMENTS

| | | | |
|---|---|---|---|
| 10,990,325 B2 | 4/2021 | Hsiao | |
| 2007/0177430 A1 | 8/2007 | Morio | |
| 2014/0269053 A1* | 9/2014 | Chen | G11C 8/20 365/185.11 |
| 2019/0205247 A1* | 7/2019 | Lin | G06F 12/0246 |
| 2022/0004510 A1 | 1/2022 | Sun | |
| 2022/0066687 A1 | 3/2022 | Lin | |

FOREIGN PATENT DOCUMENTS

| | | | |
|---|---|---|---|
| TW | I640868 B | 11/2018 | |
| TW | I734063 B | 7/2021 | |
| TW | 202249018 A | 12/2022 | |
| TW | I805505 B | 6/2023 | |

* cited by examiner

| P1 |
|---|
| P2 |
| P3 |
| |
| ⋮ |
| |
| P447 |
| P448 |

METHOD FOR CONTROLLING FLASH MEMORY MODULE AND ASSOCIATED FLASH MEMORY CONTROLLER AND MEMORY DEVICE

BACKGROUND OF THE INVENTION

1. Field of the Invention

The present invention relates to flash memory.

2. Description of the Prior Art

During the process of a flash memory controller writing data to a super block of a flash memory module, if an abnormal power-off occurs, such as power off recovery (POR) or sudden power off recovery (SPOR) occurs, the flash memory controller will determine whether it has encountered an abnormal power failure after the flash memory controller is powered on again. In the event of abnormal power failure, the flash memory controller determines which data in a super block is still valid, and performs a garbage collection operation on the super block to move the valid data to another block. However, since the super block includes multiple blocks, and the data writing progress of each block is different, how to efficiently determine the valid data in the super block is an important issue.

SUMMARY OF THE INVENTION

Therefore, one of the objects of the present invention is to provide a control method for a memory device, which can efficiently and accurately determine which data in the super block is available for use when the memory device is powered on after the memory device is powered off abnormally, and the super block can be used for continued writing of data, to solve the above-mentioned problems.

According to one embodiment of the present invention, a method for controlling a flash memory module is disclosed. The flash memory module comprises multiple dies, each die comprises multiple blocks, and each block comprises multiple pages, and the method comprises: after the flash memory module is powered on, determining whether the flash memory module encountered an abnormal power failure before the flash memory module is powered on; if the flash memory module encounters the abnormal power failure before the flash memory module is powered on, determining a last super block written by the flash memory module before powering on, where the super block comprises multiple first blocks respectively located in the multiple dies; determining a last rewritten page of the super block; determining a check range of the super block according to the last written page of the super block; read at least part of the pages in the check range to determine a last successfully read page of each first block in the super block; determining a data weak region of the super block according to the last successfully read pages of the first blocks in the super block; and moving data in the weak data region to other regions of the super block or to another super block.

According to one embodiment of the present invention, a flash memory controller is disclosed, wherein the flash memory controller is configured to access a flash memory module, the flash memory module comprises multiple dies, each die comprises multiple blocks, and each block comprises multiple pages. The flash memory controller comprises a read only memory configured to store a program code, and a microprocessor configured to execute the program code to a control access of the flash memory module. The microprocessor is configured to perform the steps of: after the flash memory module is powered on, determining whether the flash memory module encountered an abnormal power failure before the flash memory module is powered on; if the flash memory module encounters the abnormal power failure before the flash memory module is powered on, determining a last super block written by the flash memory module before powering on, where the super block comprises multiple first blocks respectively located in the multiple dies; determining a last rewritten page of the super block; determining a check range of the super block according to the last written page of the super block; read at least part of the pages in the check range to determine a last successfully read page of each first block in the super block; determining a data weak region of the super block according to the last successfully read pages of the first blocks in the super block; and moving data in the weak data region to other regions of the super block or to another super block.

According to one embodiment of the present invention, a memory device comprising a flash memory module and a flash memory controller is disclosed. The flash memory module comprises multiple dies, each die comprises multiple blocks, and each block comprises multiple pages. The flash memory controller is configured to perform the steps of: after the flash memory module is powered on, determining whether the flash memory module encountered an abnormal power failure before the flash memory module is powered on; if the flash memory module encounters the abnormal power failure before the flash memory module is powered on, determining a last super block written by the flash memory module before powering on, where the super block comprises multiple first blocks respectively located in the multiple dies; determining a last rewritten page of the super block; determining a check range of the super block according to the last written page of the super block; read at least part of the pages in the check range to determine a last successfully read page of each first block in the super block; determining a data weak region of the super block according to the last successfully read pages of the first blocks in the super block; and moving data in the weak data region to other regions of the super block or to another super block.

According to one embodiment of the present invention, a method for controlling a flash memory module is disclosed. The flash memory module comprises multiple dies, each die comprises multiple blocks, and each block comprises multiple pages, and the method comprises: selecting a super block, wherein the super block comprises multiple first blocks respectively located in the multiple dies; configuring a controller buffer, where the controller buffer comprises multiple buffers, and each buffer is used to store data to be written to a single page of the super block; receiving multiple write requests from a host device and storing the multiple write requests in a buffer request pool in sequence; selecting an earliest write request from the buffer request pool; determining whether a number of buffers occupied by the first block to be written to corresponding data of the earliest write request in the controller buffer is greater than a threshold value; and if the number of buffers occupied by the first block to be written to the corresponding data of the earliest write request in the controller buffer is greater than the threshold value, suspending writing the data corresponding to the earliest write request to the controller buffer.

According to one embodiment of the present invention, a flash memory controller is disclosed, wherein the flash memory controller is configured to access a flash memory module, the flash memory module comprises multiple dies, each die comprises multiple blocks, and each block comprises multiple pages. The flash memory controller comprises a read only memory configured to store a program code, and a microprocessor configured to execute the program code to a control access of the flash memory module. The microprocessor is configured to perform the steps of: selecting a super block, wherein the super block comprises multiple first blocks respectively located in the multiple dies; configuring a controller buffer, where the controller buffer comprises multiple buffers, and each buffer is used to store data to be written to a single page of the super block; receiving multiple write requests from a host device and storing the multiple write requests in a buffer request pool in sequence; selecting an earliest write request from the buffer request pool; determining whether a number of buffers occupied by the first block to be written to corresponding data of the earliest write request in the controller buffer is greater than a threshold value; and if the number of buffers occupied by the first block to be written to the corresponding data of the earliest write request in the controller buffer is greater than the threshold value, suspending writing the data corresponding to the earliest write request to the controller buffer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
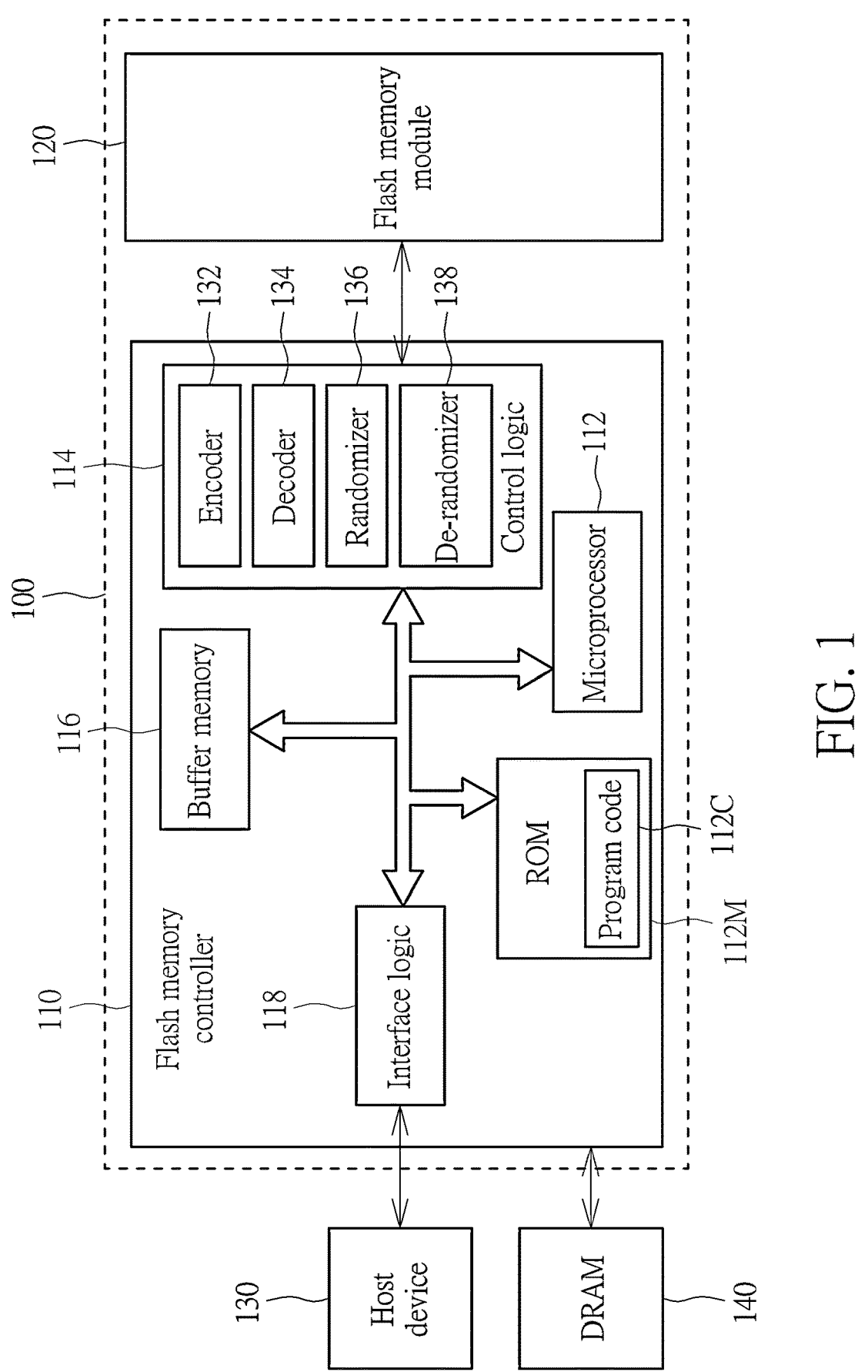
FIG. 1 is a diagram illustrating a memory device according to an embodiment of the present invention.

FIG. 1 is a diagram illustrating a memory device 100 according to an embodiment of the present invention. The memory device 100 includes a flash memory module 120 and a flash memory controller 110, wherein the flash memory controller 110 is arranged to access the flash memory module 120. The flash memory controller 110 includes a microprocessor 112, a read only memory (ROM) 112M, a control logic 114, a buffer memory 116 and an interface logic 118. The ROM 112M is arranged to store a program code 112C, and the microprocessor 112 is arranged to execute the program code 112C to control access of the flash memory module 120. The control logic 114 includes an encoder 132, a decoder 134, a randomizer 136 and a de-randomizer 138. The encoder 132 is arranged to encode data that is written into the flash memory module 120 to generate a corresponding parity (also known as an error correction code (ECC)), and the decoder 134 is arranged to decode data that is read from the flash memory module 120. The randomizer 136 is used to randomize the data written to the flash memory module 120, and the de-randomizer 138 is used to de-randomize the data read from the flash memory module 120.

In a general situation, the flash memory module 120 includes a plurality of flash memory chips, and each flash memory chip includes a plurality of blocks. A controller (e.g. the flash memory controller 110 that executes the program code 112C through the microprocessor 112) may copy, erase, and merge data for the flash memory module 120 with a block as a unit. In addition, a block can record a specific number of pages, wherein the controller (e.g. the flash memory controller 110 that executes the program code 112C through the microprocessor 112) may perform a data write operation upon the flash memory module 120 with a page as a unit. In other words, a block is the smallest erase unit in the flash memory module 120, and a page is the smallest write unit in the flash memory module 120.

In practice, the flash memory controller 110 that executes the program code 112C through the microprocessor 112 may utilize its own internal components to perform many control operations. For example, the flash memory controller 122 utilizes the control logic 114 to control access of the flash memory module 120 (more particularly, access at least one block or at least one page), utilizes the buffer memory 116 and/or a DRAM 140 to perform a required buffering operation, and utilizes the interface logic 118 to communicate with a host device 130.

In one embodiment, the memory device 100 may be a portable memory device such as a memory card which conforms to one of the SD/MMC, CF, MS and XD specifications, and the host device 130 is an electronic device able to be connected to the memory device 100, such as a cellphone, a laptop, a desktop computer, etc. In another embodiment, the memory device 100 can be a solid state drive (SSD) or an embedded storage device conforming to the universal flash storage (UFS) or embedded multi-media card (EMMC) specifications, and can be arranged in an electronic device. For example, the memory device 100 can be arranged in a cellphone, a watch, a portable medical testing device (e.g. a medical wristband), a laptop, or a desktop computer. In this case, the host device 130 can be a processor of the electronic device.

In this embodiment, the flash memory module 120 is a three-dimensional (3D) NAND-type flash memory, in which each block is composed of multiple word lines, multiple bit lines and multiple memory cells. Since the 3D NAND flash memory architecture is well known to those with ordinary knowledge in the art, no further explanation is given in the specification.

Figure 2:
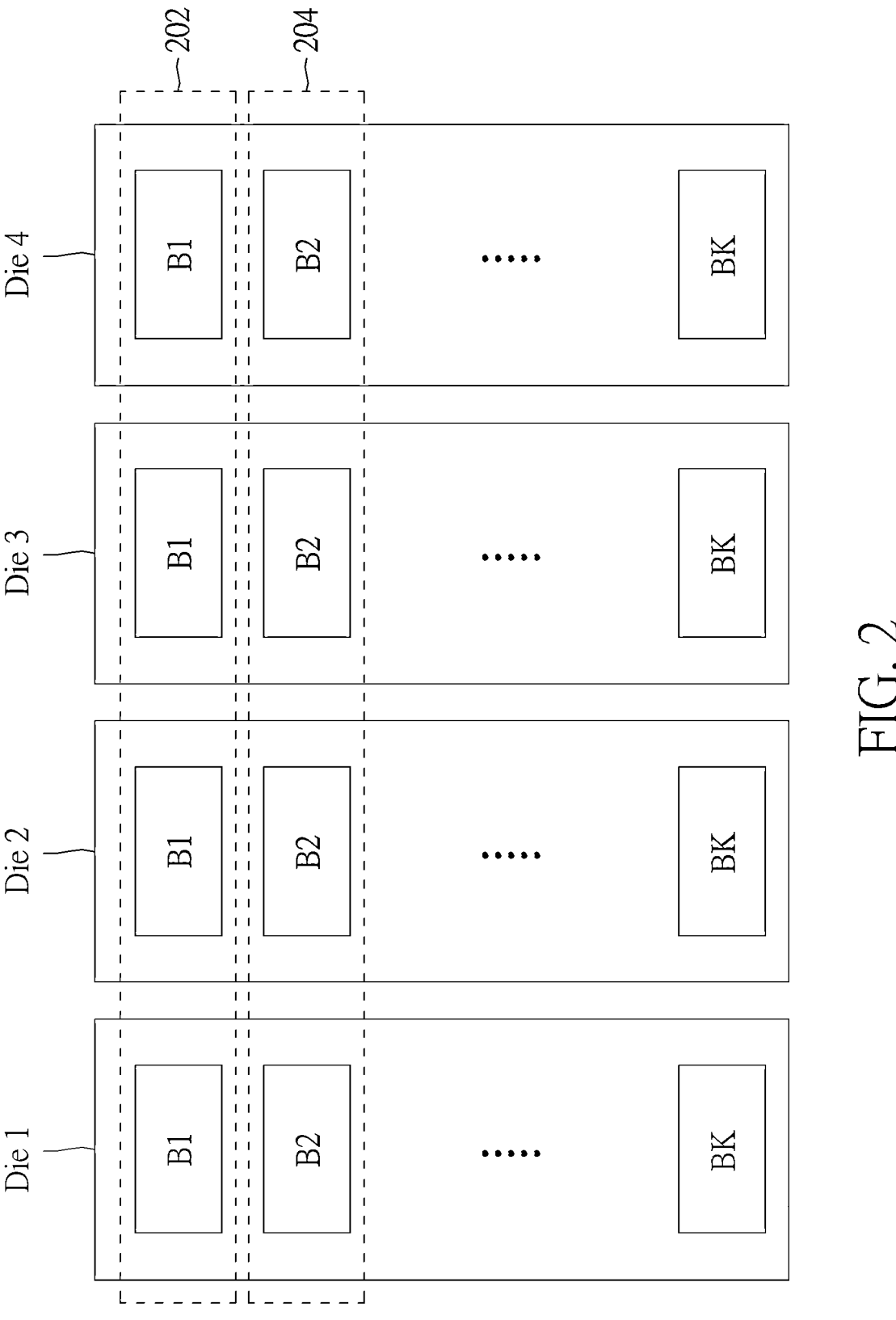
FIG. 2 is a diagram of a super block according to one embodiment of the present invention.

FIG. 2 is a diagram of a super block according to one embodiment of the present invention. As shown in FIG. 2, it is assumed that the flash memory module 120 includes four dies (die 1 to die 4), and each die includes multiple blocks B1-BK. At this time, the microprocessor 112 can configure blocks belonging to different data planes or different dies within the flash memory module 120 as a super block to facilitate management of data access. In this embodiment, there is only one data plane in one die, but the invention is not limited to this. As shown in FIG. 2, die 1 to die 4 respectively include blocks B1-BK, and the microprocessor 112 can configure the block B1 of each die as a super block 202, and configure the block B2 of each die as a super block 204, and so on. The operation of the flash memory controller 110 in accessing the super blocks 202 and 204 is similar to accessing the general blocks. For example, the super block 202 itself is an erase unit. That is, although the four blocks B1 included in the super block 202 can be erased separately, the flash memory controller 110 will definitely erase the four blocks B1 together.

Figure 3:
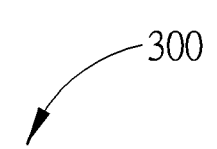
FIG. 3 is a diagram illustrating a block including multiple pages.

FIG. 3 is a diagram illustrating a block 300, wherein block 300 can be any one of the blocks B1-BK shown in FIG. 2, and the block 300 includes multiple pages, such as 448 pages in the figure. When writing data to the super block 202, the first page P1 of the block B1 of the die 1, the first page P1 of the block B1 of the die 2, the first page P1 of the die 3 and the first page P1 of the block B1 of the die 4 can be sequentially written. Then, the data is written into the second page P2 of the block B1 of die 1, the second page P2 of the block B1 of the die 2, . . . , and so on. In other words, the flash memory controller 110 writes data to the first page P1 of each block B1 in the super block 202, and then writes data to the second page P2 of each block B1 in the super block 202. The super block is a collection block logically set by the flash memory controller 110 for the convenience of managing the flash memory module 120, not a physical collection block. In addition, when performing garbage collection, calculating the effective pages of a block, and calculating the length of writing a block, calculations can also be performed in units of super blocks.

Figure 4:
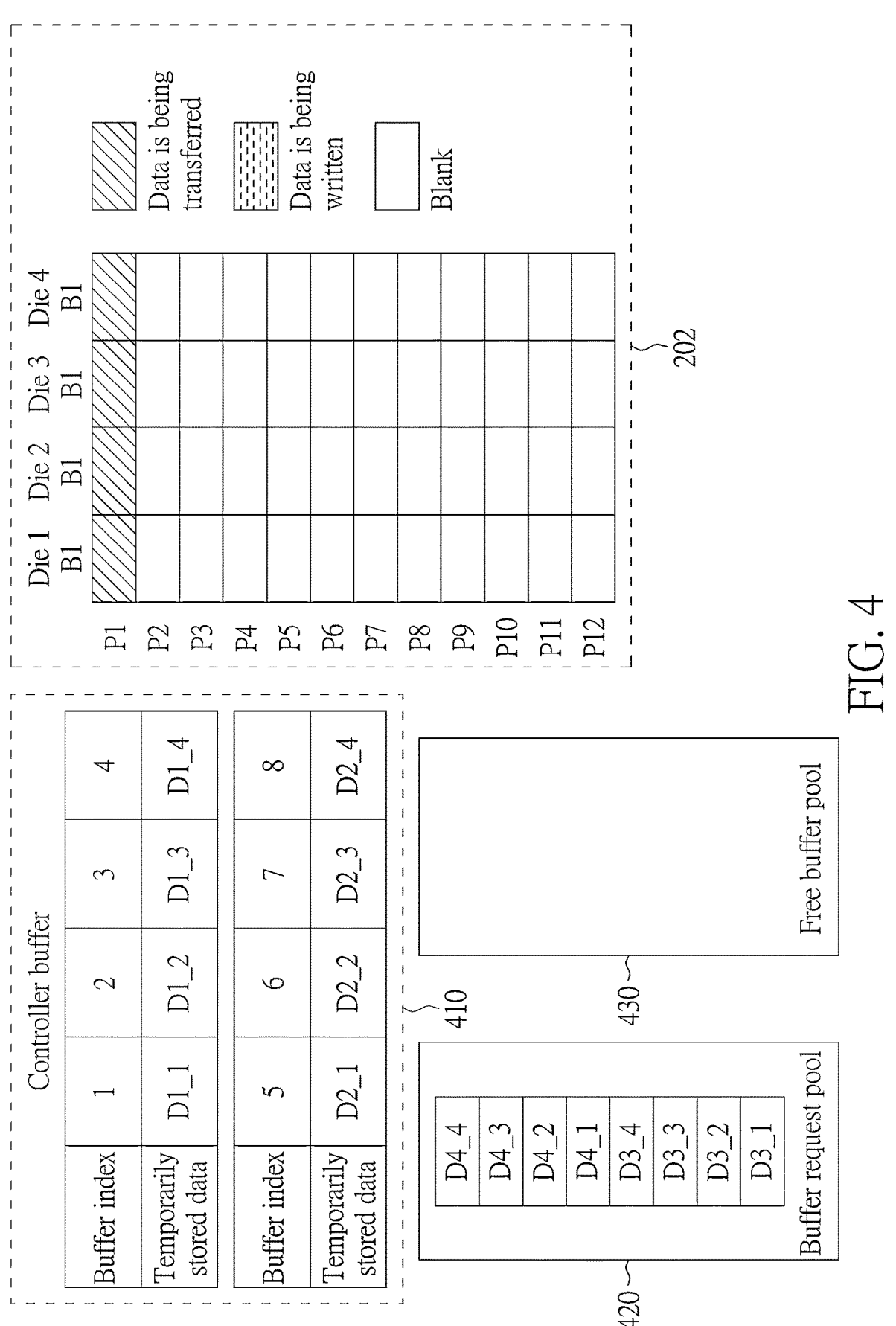
FIG. 4 is a diagram of writing data from the host device to the super block according to one embodiment of the present invention.

In one embodiment, regarding the operation of the host device 130 to write data to the flash memory module 120, with reference to FIG. 4, the buffer memory 116 includes a controller buffer 410, which includes multiple buffers for temporarily storing data from the host device 130. The interface logic 118 includes a buffer request pool 420 and a free buffer pool 430, where the buffer request pool 420 is used to indicate the data requested to be written by the host device 130, and the free buffer pool 430 is used to indicate the buffer in the controller buffer 410 that is in an idle state. In this embodiment, for convenience of explanation, the controller buffer 410 includes eight buffers, which are numbered #1-#8 respectively, but the present invention is not limited to this. In other embodiments, the number of buffers included in the controller buffer 410 may vary according to the designer's considerations. In addition, the buffer request pool 420 can be implemented by using multiple first-in-first-out (FIFO) buffers.

Specifically, referring to FIG. 4, initially the host device 130 sends one or more write requests to the buffer request pool 420 to request the data D1_1-D1_4 and D2_1-D2_4 to be written to the flash memory module 120, and since the eight buffers of the controller buffer 410 are all idle at this time, the flash memory controller 110 can obtain the data D1_1-D1_4 and D2_1-D2_4 from the host device 130 according to these write requests, and save the data D1_1-D1_4 and D2_1-D2_4 are written to buffer #1-buffer #8, respectively. In this embodiment, it is assumed that each of the data D1_1-D1_4 and D2_1-D2_4 is written into a page of the flash memory module 120, that is, the data D1_1-D1_4 are respectively prepared to be written into the page P1 of block B1 of die 1 to die 4, and the data D2_1-D2_4 are respectively prepared to be written to the page P2 of block B1 of die 1 to die 4. Then, the microprocessor 112 in the flash memory controller 110 uses a direct memory access (DMA) mechanism to send the data D1_1-D1_4 in the buffer #1-buffer #4 to the flash memory module 120 in parallel.

Figure 5:
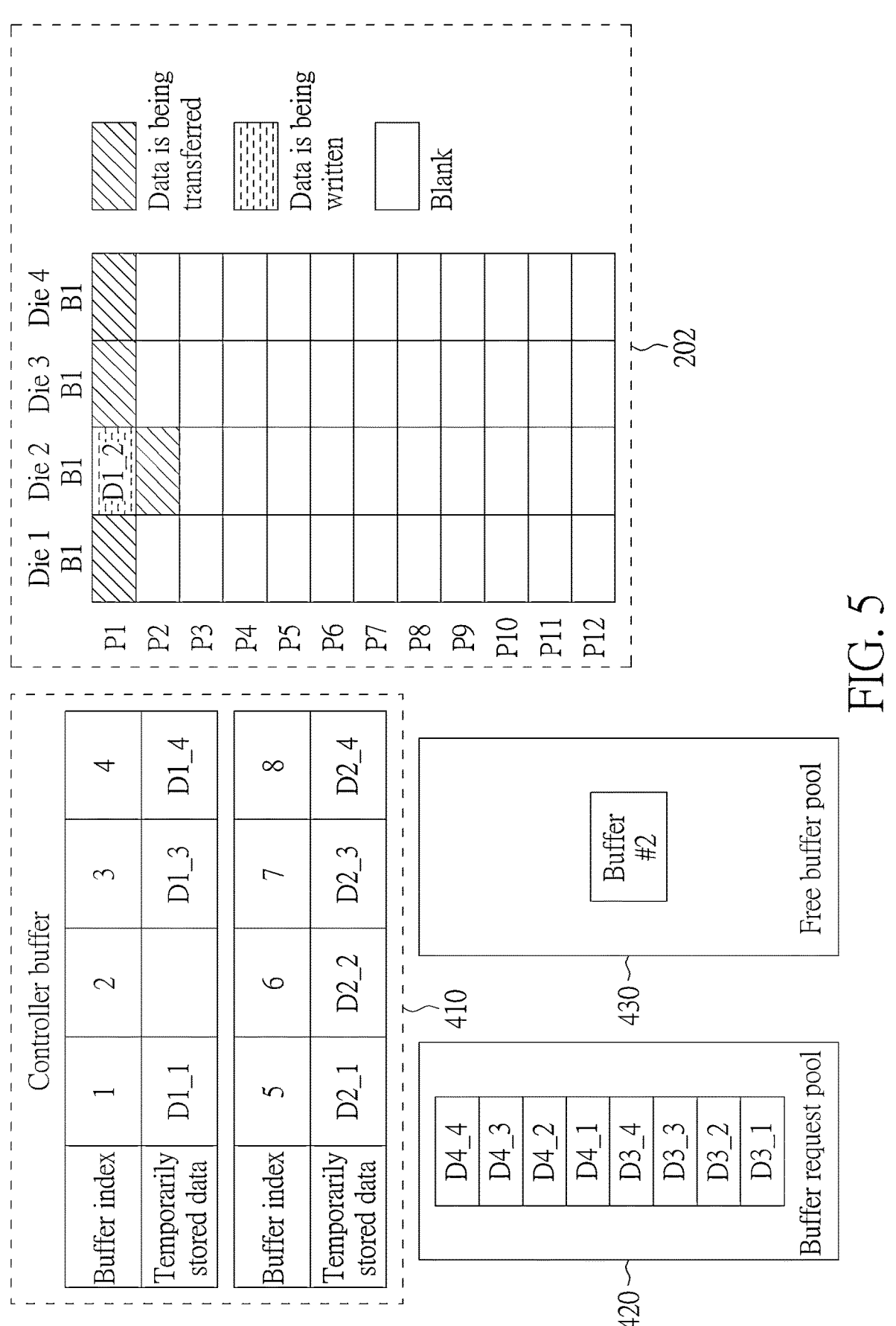
FIG. 5 is a diagram of writing data from the host device to the super block according to one embodiment of the present invention.

Then, referring to FIG. 5, assuming that the flash memory module 120 successfully receives the data D1_2 first, the hardware components inside the flash memory module 120 will begin to write the data D1_2 to the page P1 of block B1 of die 2. At this time, the space in the buffer #2 is released, and free buffer pool 430 will record that buffer #2 is currently idle.

Figure 6:
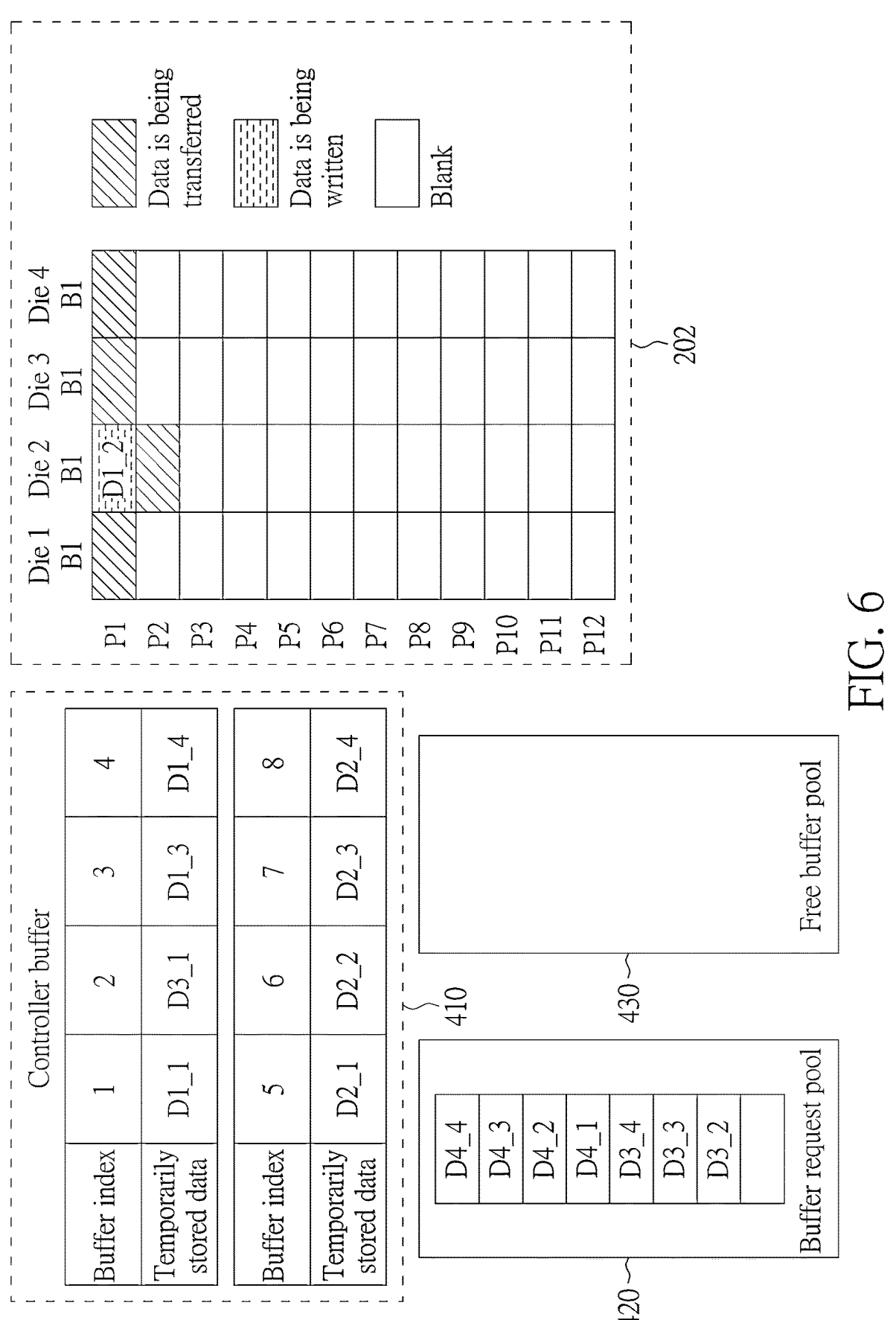
FIG. 6 is a diagram of writing data from the host device to the super block according to one embodiment of the present invention.

Then, referring to FIG. 6, since the space of the buffer #2 is released, the data D3_1 corresponding to the first write request of buffer request pool 420 will be written to the buffer #2, and the free buffer pool 430 will not record that any buffer is currently idle at this time.

Figure 7:
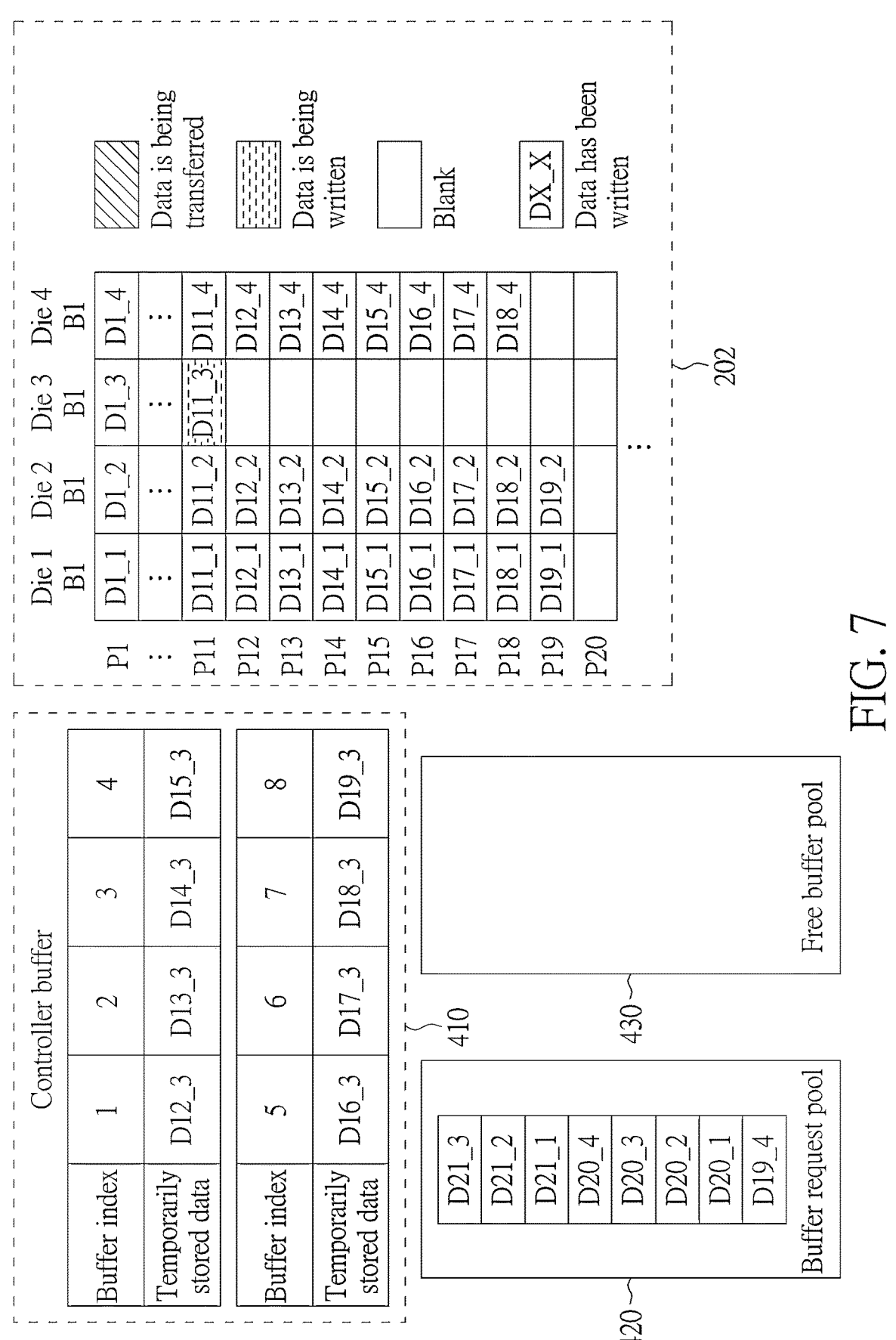
FIG. 7 is a diagram showing that in the worst case, the difference in write pages between two dies/blocks will be equal to the number of buffers in the controller buffer.

As mentioned above, when a buffer in the controller buffer 410 is in an idle state, the flash memory controller will receive data from the host device 130 according to the first write request of the buffer request pool 420 (that is, the earliest write request), and write the data to this idle buffer. However, since each die in the flash memory module 120 has its own back-end hardware so that the flash memory module 120 can write data into multiple dies in parallel, and the processing speed of each die and the corresponding back-end hardware will vary slightly due to the semiconductor manufacturing process, the small differences in the writing speed of each die will continue to accumulate, resulting in a large difference in the data writing of the multiple dies. For example, referring to FIG. 7, assuming that die 3 is slower than other dies in data writing speed, so in the worst case, the difference between the page being written in die 3 and the page that has been written in die 2 will be equal to the number of buffers in the controller buffer 410 (that is, eight pages). As shown in FIG. 7, when die 2 has written data D19_2 to the page P19, die 3 is writing data D11_3 to the page P11. In this worst case, all the buffers #1-#8 will store the data to be written to block B1 of die 3, such as D12_3-D19_3 as shown in FIG. 7, causing the overall writing speed to be limited by die 3.

However, if an abnormal power failure occurs when the data shown in FIG. 4 is written to the super block 202, such as a SPOR, the flash memory controller 110 will read the contents of the super block 202 to determine the status of the super block 202 after the memory device 100 is powered on, so as to determine an appropriate processing method. This embodiment provides a control method after the memory device 100 is powered on, which can efficiently and accurately determine which data in the super block 202 can be used, and continue to write data into the super block 202, to optimize the use of the super block 202.

Figure 8:
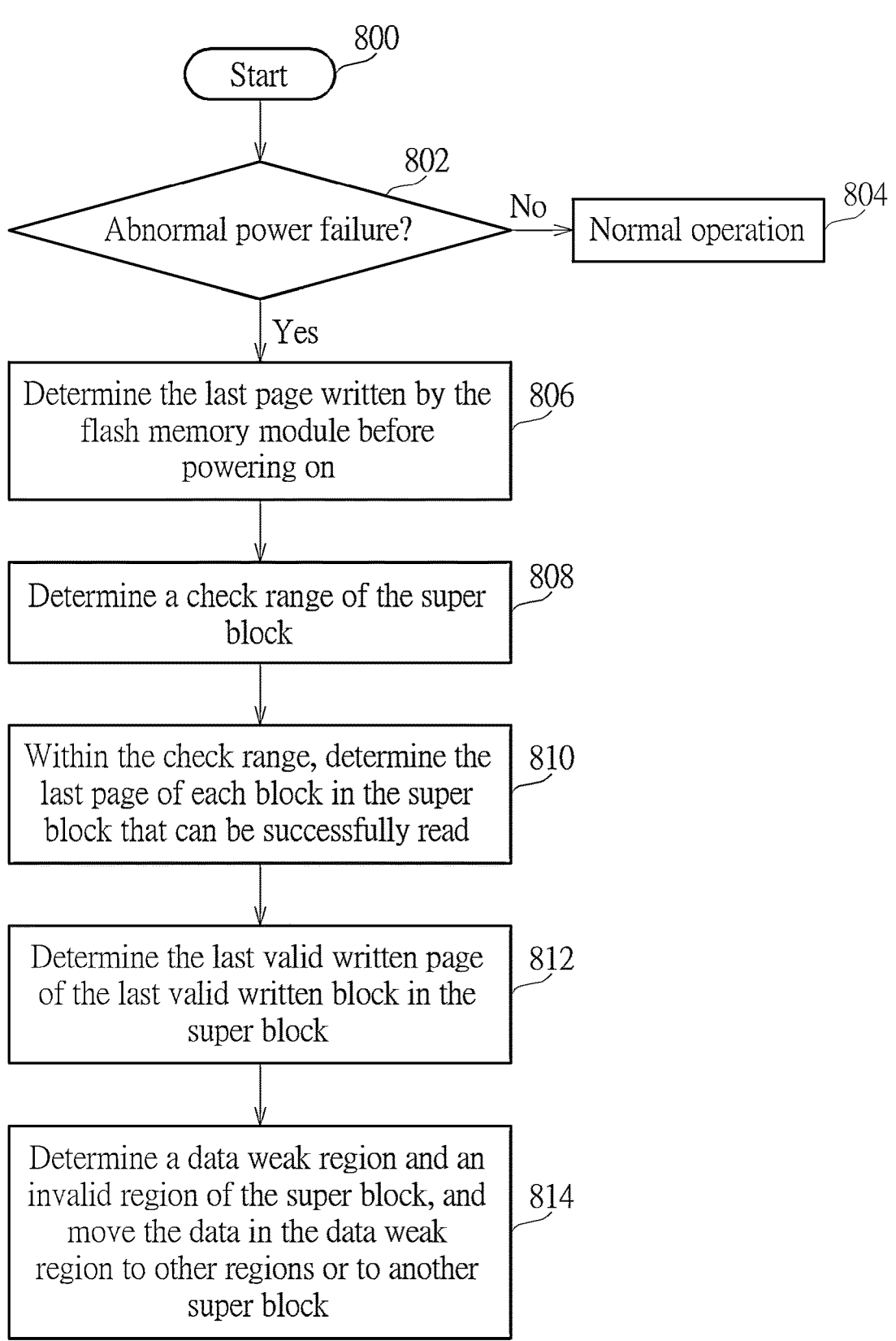
FIG. 8 is a flowchart of a control method of the memory device according to one embodiment of the present invention.

FIG. 8 is a flowchart of a control method of the memory device 100 according to one embodiment of the present invention. In Step 800, the flow starts, and the memory device 100 has been powered on and initialized. In Step 802, the flash memory controller 110 determines whether an abnormal power failure occurs before the memory device 100 is powered on, if yes, the flow enters Step 806; and if not, the flow enters Step 804. In one embodiment, when the memory device 100 is shut down/powered off normally, the flash memory controller 110 will store multiple temporary tables and data stored in the buffer memory 116 to the flash memory module 120, wherein the stored data includes a flag used to indicate whether the memory device 100 is powered off normally. Therefore, after powering on, the flash memory controller 110 can determine whether the memory device 100 has an abnormal power failure before by reading the above-mentioned tag stored at a specific address in the flash memory module 120. For example, when the above tag is not set correctly, it is determined that an abnormal power failure has been encountered before.

In Step 804, since the memory device 100 did not encounter an abnormal power failure before powering on, the flash memory controller 110 begins to operate normally, such as writing data from the host device 130 to the flash memory module 120, or performs a garbage collection operation on the flash memory module 120, etc., that is, the flash memory controller 110 will not execute Step 806-Step 816 in FIG. 8.

In Step 806, the flash memory controller 110 determines the last page written by the flash memory module 120 before powering on. Specifically, Step 806 may include the following operations: first, the flash memory controller 110 determines the last super block written by the flash memory module 120 before powering on, and then determines the last block of the first die included in the super block, and the last page written by the flash memory module 120 before powering on is found based on the last written page of the block of the first die. For example, the flash memory controller 110 may search for the super block in the active state recorded in the flash memory module 120 as the last super block written before powering on. In the following embodiments, the super block 202 shown in FIG. 7 is used as an illustration. Then, for the first block in the super block, such as block B1 of the super block 202, the flash memory controller 110 uses a binary search method or any other suitable methods to search for the last page in the first block that has data written to it. Taking FIG. 7 as an example, the flash memory controller 110 searches out page P19 of block B1 of die 1 as the last page with data written. Finally, the flash memory controller 110 searches to the right from the page P19 of block B1 of die 1, that is, reads the content of the page and determines whether there is data written, so as to determine the page P19 of block B1 of die 2 as the last page written to the flash memory module 120 before powering on.

Figure 9:
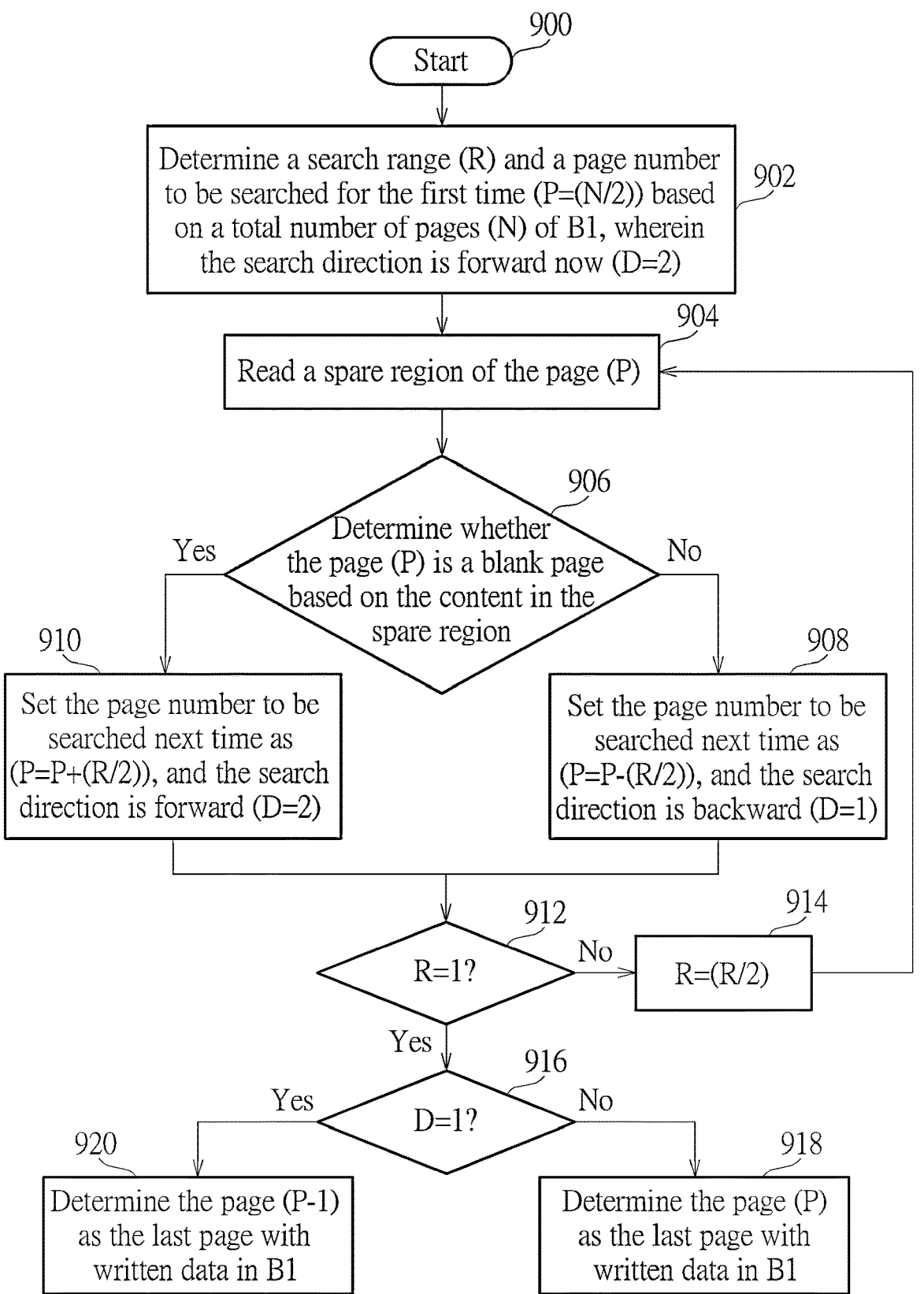
FIG. 9 is a flowchart of using a binary search method to search the last page with data written in the block.

FIG. 9 is a flowchart of using a binary search method to search the last page with data written in the block B1 of die 1. The flow is described as follows.

Step 900: the flow starts.

Step 902: determine a search range (R) and a page number to be searched for the first time (P=(N/2)) based on a total number of pages (N) in the block B1, wherein the search direction is forward now (D=2, that is, the direction in which the page number increases).

Step 904: read a spare region of the page (P).

Step 906: determine whether the page (P) is a blank page based on the content in the spare region, for example, determine whether the page (P) is a blank page based on whether the metadata is recorded in the spare region. If it is determined that the page (P) is a blank page, the flow enters Step 908; and if it is determined that the page (P) is not a blank page, the flow enters Step 910.

Step 908: set the page number to be searched next time as (P=P−(R/2)), and the search direction at this time is backward (D=1, the direction in which the page number decreases).

Step 910: set the page number to be searched next time as (P=P+(R/2)), and the search direction at this time is forward (D=2).

Step 912: determine whether the search range (R) is 1. If not, the flow enters Step 914; and if yes, the flow enters Step 916.

Step 914: halve the search range (R=(R/2)), and the flow goes back to Step 904.

Step 916: determine whether the search direction is backward (D=1). If not, the flow enters Step 918; and if yes, the flow enters Step 920.

Step 918: determine the page (P) as the last page with written data in the block B1.

Step 920: determine the page (P−1) as the last page with written data in the block B1.

It should be noted that the detailed steps shown in FIG. 9 are only used as examples and are not limitations of the present invention.

In addition, the above detailed operations of Step 806 are only used as examples and are not limitations of the present invention. In other embodiments, the flash memory controller 110 may perform a binary search on two or more blocks in the super block 202 to search for the last page with data written in these blocks, and then compare the number of the last pages with data written in these blocks to obtain the last page written by the flash memory module 120 before powering on.

Figure 10:
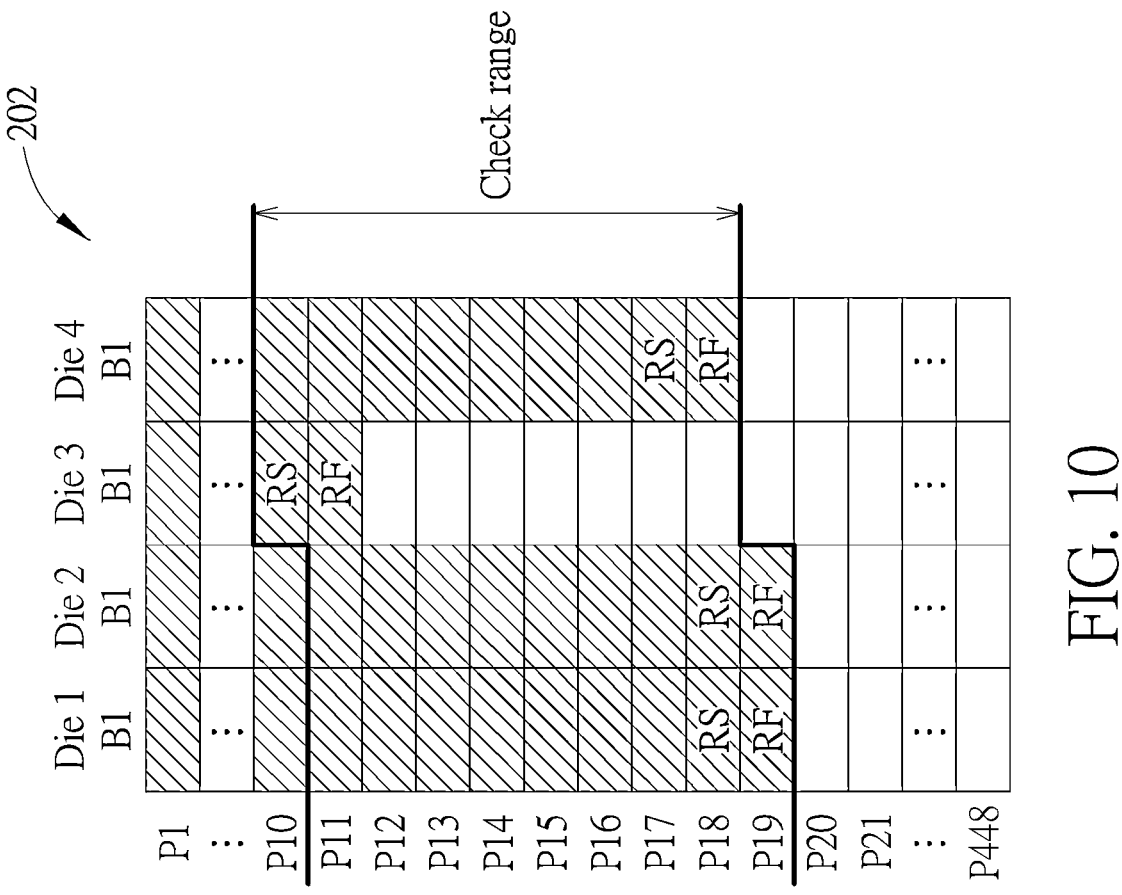
FIG. 10 is a diagram of determining the last successfully read page of each block in the super block and determining a check range accordingly.

In Step 808, after determining the last page written by the flash memory module 120 before powering on, the flash memory controller 110 determines a check range of the super block 202. In one embodiment, referring to FIG. 7 and related content, in the worst case, the difference between the page being written in die 3 and the page that has been written in die 2 will be equal to the number of buffers in the controller buffer 410. Therefore, assuming that the number of buffers in the controller buffer 410 is "N", the flash memory controller 110 can push back the "N+1" page from the number of the last page written by the flash memory module 120 before powering, that is, flash memory controller 110 may subtract "N" from the number of the last written page to obtain the check range. Taking FIG. 10 as an example, assuming that the last page written by the flash memory module 120 before powering on is the page P19 of block B1 of die 2, then the flash memory controller 110 can determine that a lower boundary of the check range is the pages P19, P19, P18 and P18 of the four blocks included in the super block 202 (that is, the block of die 1 whose writing sequence is earlier than die 2 is set to have the same page number P19, and the blocks B1 of die 3 and 4 whose writing sequence is later than die 2 is set to the page number minus "1"), and then subtract "N" from these page numbers to obtain that the upper boundary of the check range includes the pages P11, P11, P10, and P10 of the four blocks included in the super block 202.

It should be noted that since what is described in FIG. 7 is the worst case, in another embodiment of Step 808, the upper boundary of the check range may be based on the quality or the operation of the flash memory module 120, so that the check range has fewer pages. For example, assuming that the number of buffers in the controller buffer 410 is "N", the flash memory controller 110 can subtract "P" from the number of the last written page according to the flash memory module 120 to obtain the upper boundary of the check range, where "P" can be any suitable value less than "N".

In Step 810, the flash memory controller 110 reads sequentially from the lower boundary to the upper boundary of the check range, or reads sequentially from the upper boundary to the lower boundary of the check range, until the read data can be successfully decoded by the decoder 134, that is, the decoder 134 can successfully use the error correction code of the read data to complete the decoding operation to determine the last page of each block in the super block 202 that can be successfully read (i.e., decoded successfully). Taking FIG. 10 as an example, the decoder 134 cannot successfully decode the data of page P19 of the block B1 of die 1, but can successfully decode the data of page P18 of the block B1 of die 1, so the flash memory controller 110 determines that the last successfully read page in block B1 of die 1 is P18. Similarly, the flash memory controller 110 determines that the last successfully read page in block B1 of die 2 is P18, the last successfully read page in block B1 of die 3 is P10, and the last successfully read page in block B1 of die 4 is P17.

In Step 812, based on the last successfully read pages of each block in the super block 202, the flash memory controller 110 determines a page with the smallest page number and a corresponding specific block or a specific die, to determine the last valid written page of the last valid written block in the super block 202. In one embodiment, if the number of the specific block or the number of the die to which the specific block belongs is N, where N is greater than 1, the number of the page with the smallest page number is M, then the number of the die to which a valid written block belongs is "N–1", and the last valid written page is "M+1". Taking FIG. 10 as an example, the specific die is die 3, and the page with the smallest page number is P10, then the last valid written page in the super block 202 is page P11 of the block B1 of die 2. In addition, if the specific block belongs to die 1, the die to which the last valid written block belongs is the die with the largest number (for example, die 4 in FIG. 10), and the last valid written page is "M".

Figure 11:
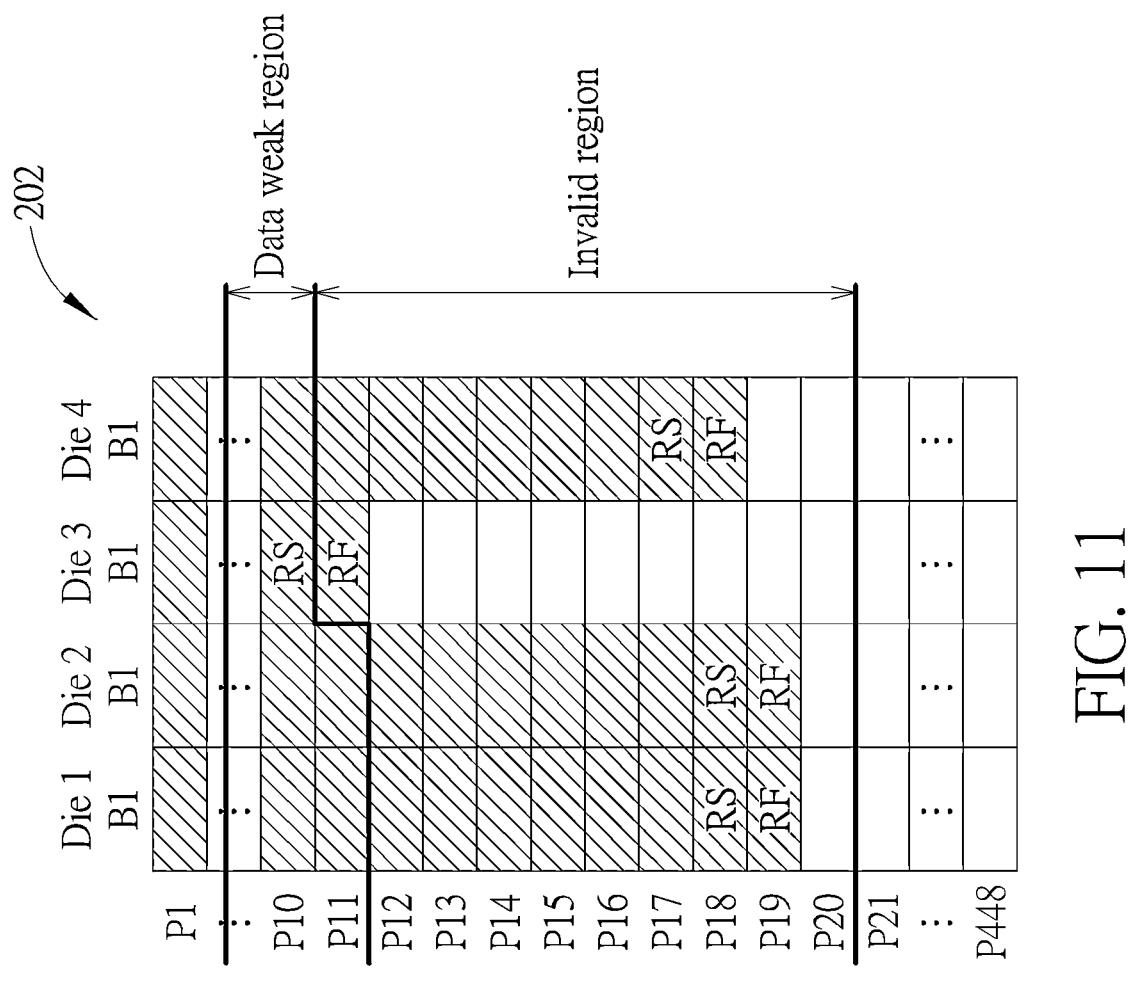
FIG. 11 is a diagram of determining a data weak region and an invalid region of the super block.

In Step 814, the flash memory controller 110 determines a data weak region and an invalid region of the super block 202 according to the last valid written block and the last valid written page in the super block 202 determined in Step 812, and the flash memory controller 110 moves the data in the data weak region to other regions in the super block 202 or to another super block. Referring to FIG. 11, the flash memory controller 110 can push back the last valid written page in the super block 202 several pages (for example, corresponding to one or two word lines) to determine the data weak region. For example, the data weak region may include page P5-P10 of block B1 of die 1 to die 4, and page P11 of the block B1 of die 1 and die 2. In addition, the flash memory controller 110 can determine the invalid region of the super block by moving the lower boundary of the check range back several pages (for example, the number of pages corresponding to one or two word lines). For example, the invalid region may include page P11 of the block B1 of die 3 and die 4, and pages P12-P20 of the blocks B1 of die 1 to die 4.

In one embodiment, since the data weak region of the super block 202 can be regarded as a region with unstable data, if the space behind the invalid region in the super block 202 is sufficient, the flash memory controller 110 can copy the data of the data weak region to the space after the invalid region in the super block 202, such as page P21 of the block B1 of die 1 to die 4 and subsequent pages. If the space after the invalid region in the super block 202 is insufficient, the flash memory controller 110 copies the data in the weak region to another super block.

In one embodiment, the flash memory controller 110 can perform double programming on the invalid region of the super block 202, that is, write invalid data or redundant data into the invalid region in order to stabilize the super block 202.

In the above embodiments of FIG. 7-FIG. 10, after the memory device 100 is powered on again, the flash memory controller 110 will need to determine a check range to determine the last page of each block of the super block 202 that can be successfully read (i.e., the last valid written page), and the upper boundary the check range is determined based on the number of buffers in the controller buffer 410. However, in some designs, the number of buffers in the controller buffer 410 will be very large. Therefore, if the upper boundary of the check range is determined based on the number of buffers in the controller buffer 410, it will make the check range include a large number of pages, so the flash memory controller 110 may need to read a large number of pages to determine the last pages that can be successfully in the super block 202, which affects the execution efficiency of the device 100 after powering on.

Therefore, in order to solve the above problem, this embodiment also proposes a method that can limit the number of buffers that the data of each die can occupy in the controller buffer 410, so as to avoid the problem that the writing pages of different blocks of the super block 202 are too different as shown in FIG. 7.

Figure 12:
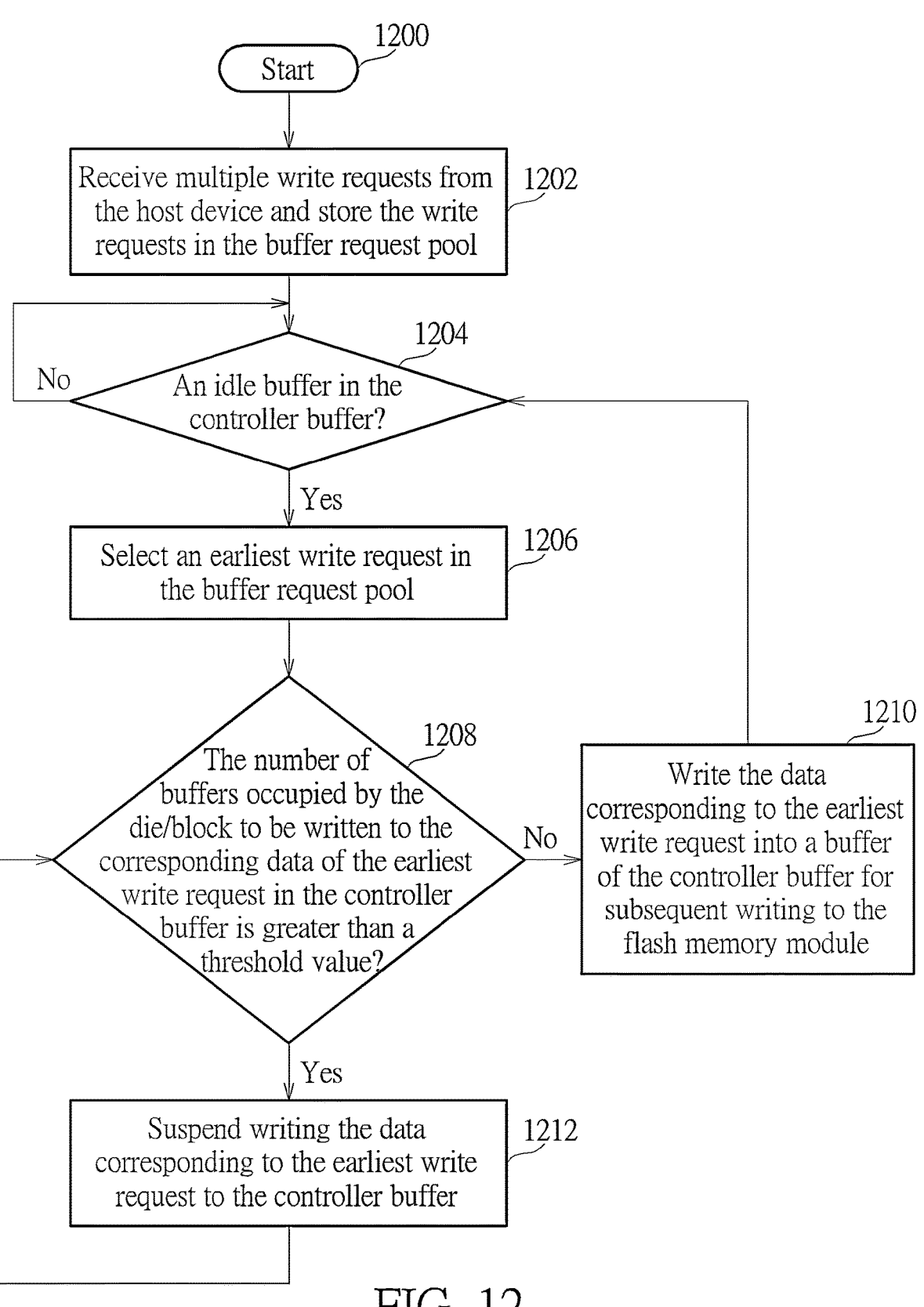
FIG. 12 is a flowchart of a control method of a memory device according to one embodiment of the present invention.

FIG. 12 is a flowchart of a control method of a memory device 100 according to one embodiment of the present invention. In Step 1200, the flow starts. In Step 1202, the flash memory controller 110 receives multiple write requests from the host device 130 and stores the write requests in the buffer request pool 420. In Step 1204, the flash memory controller 110 determines whether there is an idle buffer in the controller buffer 410 according to the content of the free buffer pool 430, if yes, the flow enters Step 1206; and if not, the flow stays in Step 1204.

In Step 1206, the flash memory controller 110 selects an earliest write request in the buffer request pool 420. In Step 1208, the flash memory controller 110 determines whether the number of buffers occupied by the die/block to be written to the corresponding data of the earliest write request in the controller buffer 410 is greater than a threshold value, if yes, the flow enters Step 1212; and if not, the flow enters Step 1210. In this embodiment, the threshold value is any suitable value lower than the total number of buffers in the controller buffer 410. For example, assume that the controller buffer 410 shown in FIG. 4-FIG. 7 includes eight buffers, the threshold can be any suitable value lower than "8", such as 2, 3, 4, 5, . . . and so on.

In Step 1210, the flash memory controller 110 writes the data corresponding to the earliest write request into a buffer of the controller buffer 410 for subsequent writing to the flash memory module 120.

In Step 1212, the flash memory controller 110 suspends writing the data corresponding to the earliest write request to the controller buffer 410, even if the controller buffer 410 includes a buffer in an idle state, and the flow goes back to Step 1208.

Figure 13:
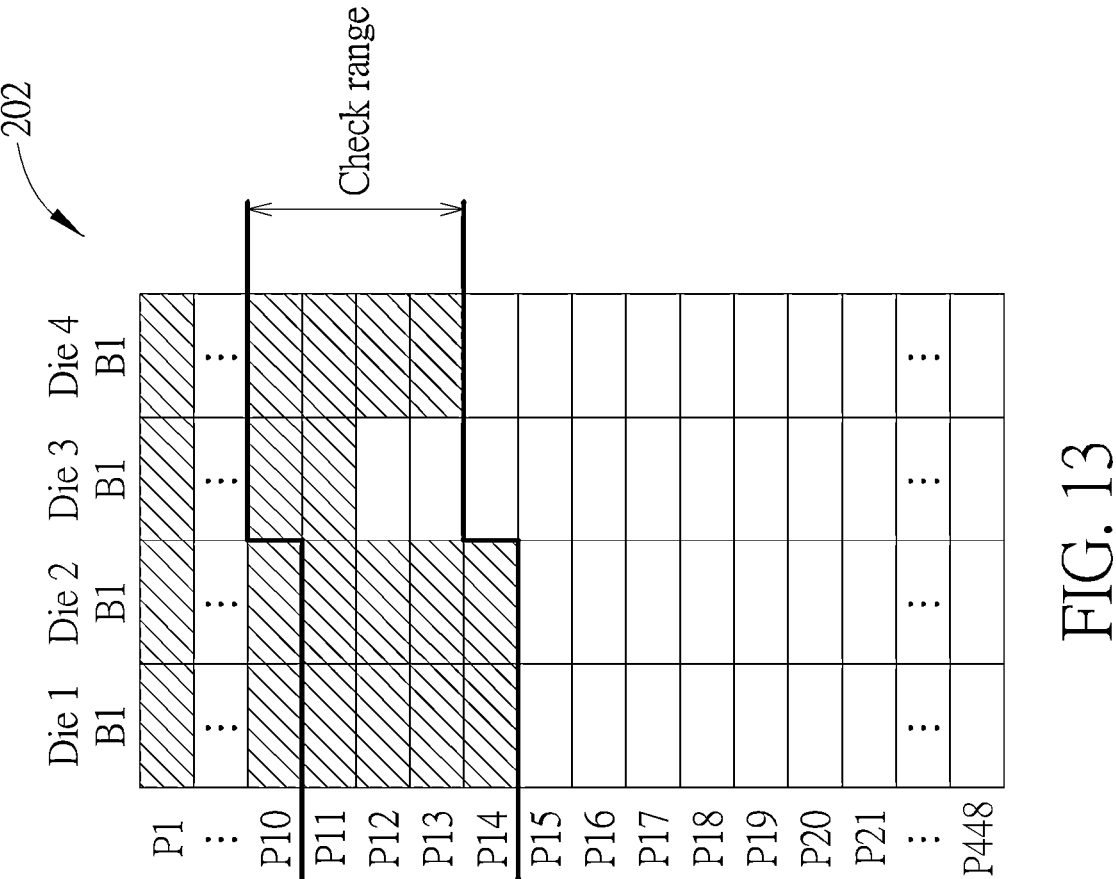
FIG. 13 is a diagram of reducing the check range of a super block according to one embodiment of the present invention.

As described in the flowchart shown in FIG. 12, by using the threshold value to limit the number of buffers occupied by each die/block in the controller buffer 410, the problem of excessive differences in write pages of different blocks in the super block 202 shown in FIG. 7 can be avoided. For example, assuming that the threshold value is "2", that is, the controller buffer 410 can store up to two data to be written to the same die/block. Referring to FIG. 7 and FIG. 13 together, when the controller buffer 410 has stored the data D12_3 and D13_3 to be written to the block B1 of die 3, the data D12_4 cannot be written to the controller buffer 410 until the data D12_3 is successfully transmitted to the flash memory module 120 and the space of the buffer is released. Therefore, if an abnormal power failure occurs at this time, after the memory device 100 is powered on again, "T" can be subtracted from the number of the last written page to obtain the upper boundary of the check range in step 808, where "T" can be the threshold (i.e., the controller buffer 410 can store at most T data to be written to the same die/block). In the embodiment shown in FIG. 13, "T" is equal to "4".

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for controlling a flash memory module, wherein the flash memory module comprises multiple dies, each die comprises multiple blocks, and each block comprises multiple pages, and the method comprises:

after the flash memory module is powered on, determining whether the flash memory module encountered an abnormal power failure before the flash memory module is powered on;

if the flash memory module encounters the abnormal power failure before the flash memory module is powered on, determining a last super block written by the flash memory module before powering on, where the super block comprises multiple first blocks respectively located in the multiple dies;

determining a last written page of the super block;

determining a check range of the super block according to the last written page of the super block;

read at least part of the pages in the check range to determine a last successfully read page of each first block in the super block;

determining a data weak region of the super block according to the last successfully read pages of the first blocks in the super block; and moving data in the weak data region to other regions of the super block or to another super block;

wherein the step of determining the check range of the super block according to the last written page of the super block comprises:

determining an upper boundary of the check range according to a number of buffers within a controller buffer, wherein each buffer is used to store data to be written to a single page of the super block; and determining a lower boundary of the check range according to the last written page of the super block.

2. The method of claim 1, wherein the step of determining the upper boundary of the check range according to the number of buffers within the controller buffer comprises:

subtracting the number of buffers from a page number of the last written page in the super block to obtain the upper boundary of the check range.

3. The method of claim 1, wherein the step of determining the upper boundary of the check range according to the number of buffers within the controller buffer comprises:

subtracting a threshold value from a page number of the last written page in the super block to obtain the upper boundary of the check range, wherein the threshold value is lower than the number of buffers within the controller buffer.

4. The method of claim 1, wherein the step of determining the data weak region of the super block according to the last successfully read pages of the first blocks in the super block comprises:

determining a page with a smallest page number and a corresponding specific first block according to the last successfully read pages of the first blocks in the super block;

determining a last valid written page of a last valid written first block in the super block according to the page with the smallest page number and the corresponding specific first block; and determining the data weak region according to the last valid written page of the last valid written first block in the super block.

5. A flash memory controller, wherein the flash memory controller is configured to access a flash memory module, the flash memory module comprises multiple dies, each die comprises multiple blocks, and each block comprises multiple pages; and the flash memory controller comprises:

a read only memory, configured to store a program code; and a microprocessor, configured to execute the program code to a control access of the flash memory module;

wherein the microprocessor is configured to perform the steps of:

after the flash memory module is powered on, determining whether the flash memory module encountered an abnormal power failure before the flash memory module is powered on;

if the flash memory module encounters the abnormal power failure before the flash memory module is powered on, determining a last super block written by the flash memory module before powering on, where the super block comprises multiple first blocks respectively located in the multiple dies;

determining a last written page of the super block;

determining a check range of the super block according to the last written page of the super block;

read at least part of the pages in the check range to determine a last successfully read page of each first block in the super block;

determining a data weak region of the super block according to the last successfully read pages of the first blocks in the super block; and moving data in the weak data region to other regions of the super block or to another super block;

wherein the step of determining the check range of the super block according to the last written page of the super block comprises:

determining an upper boundary of the check range according to a number of buffers within a controller buffer, wherein each buffer is used to store data to be written to a single page of the super block; and determining a lower boundary of the check range according to the last written page of the super block.

6. The flash memory controller of claim 5, wherein the step of determining the upper boundary of the check range according to the number of buffers within the controller buffer comprises:

subtracting the number of buffers from a page number of the last written page in the super block to obtain the upper boundary of the check range.

7. The flash memory controller of claim 5, wherein the step of determining the upper boundary of the check range according to the number of buffers within the controller buffer comprises:

subtracting a threshold value from a page number of the last written page in the super block to obtain the upper boundary of the check range, wherein the threshold value is lower than the number of buffers within the controller buffer.

8. The flash memory controller of claim 5, wherein the step of determining the data weak region of the super block according to the last successfully read pages of the first blocks in the super block comprises:

determining a page with a smallest page number and a corresponding specific first block according to the last successfully read pages of the first blocks in the super block;

determining a last valid written page of a last valid written first block in the super block according to the page with the smallest page number and the corresponding specific first block; and determining the data weak region according to the last valid written page of the last valid written first block in the super block.

9. A memory device, comprising:

a flash memory module, wherein the flash memory module comprises multiple dies, each die comprises multiple blocks, and each block comprises multiple pages; and a flash memory controller, configured to access the flash memory module;

wherein the flash memory controller is configured to perform the steps of:

after the flash memory module is powered on, determining whether the flash memory module encountered an abnormal power failure before the flash memory module is powered on;

if the flash memory module encounters the abnormal power failure before the flash memory module is powered on, determining a last super block written by the flash memory module before powering on, where the super block comprises multiple first blocks respectively located in the multiple dies;

determining a last written page of the super block;

determining a check range of the super block according to the last written page of the super block;

read at least part of the pages in the check range to determine a last successfully read page of each first block in the super block;

determining a data weak region of the super block according to the last successfully read pages of the first blocks in the super block; and moving data in the weak data region to other regions of the super block or to another super block;

wherein the step of determining the check range of the super block according to the last written page of the super block comprises:

determining an upper boundary of the check range according to a number of buffers within a controller buffer, wherein each buffer is used to store data to be written to a single page of the super block; and determining a lower boundary of the check range according to the last written page of the super block.

10. The memory device of claim 9, wherein the step of determining the upper boundary of the check range according to the number of buffers within the controller buffer comprises:

subtracting the number of buffers from a page number of the last written page in the super block to obtain the upper boundary of the check range.

11. The memory device of claim 9, wherein the step of determining the upper boundary of the check range according to the number of buffers within the controller buffer comprises:

subtracting a threshold value from a page number of the last written page in the super block to obtain the upper boundary of the check range, wherein the threshold value is lower than the number of buffers within the controller buffer.

12. The memory device of claim 9, wherein the step of determining the data weak region of the super block according to the last successfully read pages of the first blocks in the super block comprises:

determining a page with a smallest page number and a corresponding specific first block according to the last successfully read pages of the first blocks in the super block;

determining a last valid written page of a last valid written first block in the super block according to the page with the smallest page number and the corresponding specific first block; and determining the data weak region according to the last valid written page of the last valid written first block in the super block.

* * * * *